(12) United States Patent
Nakatani

(10) Patent No.: US 7,735,368 B2
(45) Date of Patent: Jun. 15, 2010

(54) ACCELERATION SENSOR

(75) Inventor: Goro Nakatani, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 257 days.

(21) Appl. No.: 11/833,061

(22) Filed: Aug. 2, 2007

(65) Prior Publication Data
US 2008/0250859 A1 Oct. 16, 2008

(30) Foreign Application Priority Data
Aug. 3, 2006 (JP) ............................. 2006-212352

(51) Int. Cl.
*G01P 3/00* (2006.01)
(52) U.S. Cl. .................. 73/497; 73/510; 73/514.33
(58) Field of Classification Search .................. 73/488, 73/493, 497, 510, 514.01
See application file for complete search history.

(56) References Cited

U.S. PATENT DOCUMENTS

| | | | |
|---|---|---|---|
| 5,581,034 A * | 12/1996 | Dao et al. ................. | 73/514.09 |
| 5,719,333 A * | 2/1998 | Hosoi et al. .............. | 73/514.05 |
| 5,786,744 A * | 7/1998 | Nishio et al. .............. | 338/14 |
| 5,945,601 A * | 8/1999 | Hosoi et al. .............. | 73/514.33 |
| 6,171,880 B1 * | 1/2001 | Gaitan et al. ............... | 438/52 |
| 6,182,509 B1 * | 2/2001 | Leung ....................... | 73/514.05 |
| 6,255,741 B1 * | 7/2001 | Yoshihara et al. ........... | 257/792 |
| 6,494,358 B2 * | 12/2002 | Narita et al. .................. | 228/41 |
| 6,589,433 B2 * | 7/2003 | Leung ........................... | 216/2 |
| 6,750,521 B1 * | 6/2004 | Chilcott et al. .............. | 257/414 |
| 6,795,752 B1 * | 9/2004 | Zhao et al. .................. | 700/299 |
| 7,069,785 B2 * | 7/2006 | Chou ....................... | 73/514.09 |
| 7,268,435 B2 * | 9/2007 | Ohta ........................... | 257/777 |
| 7,562,574 B2 * | 7/2009 | Moon et al. .................... | 73/521 |
| 2001/0042771 A1 * | 11/2001 | Narita et al. .................... | 228/41 |
| 2002/0180556 A1 * | 12/2002 | Watanabe et al. ........... | 333/126 |
| 2004/0103720 A1 * | 6/2004 | Chou ....................... | 73/514.09 |
| 2004/0137708 A1 * | 7/2004 | Shibata ........................ | 438/617 |
| 2005/0274180 A1 * | 12/2005 | Zhao et al. ...................... | 73/497 |
| 2005/0274187 A1 | 12/2005 | Zhao et al. | |
| 2006/0196270 A1 * | 9/2006 | Ino ........................... | 73/514.16 |
| 2007/0096249 A1 * | 5/2007 | Roeper et al. ................ | 257/528 |

FOREIGN PATENT DOCUMENTS

JP 2000-193677 7/2000

* cited by examiner

*Primary Examiner*—Hezron Williams
*Assistant Examiner*—Samir M Shah
(74) *Attorney, Agent, or Firm*—Rabin & Berdo, PC

(57) ABSTRACT

An acceleration sensor of the present invention is a heat sensing type acceleration sensor, and includes a heating chip formed with a heating element on a surface thereof, and a sensor chip formed with a thermocouple element on a surface thereof and disposed so that the surface faces the surface of the heating chip.

3 Claims, 2 Drawing Sheets

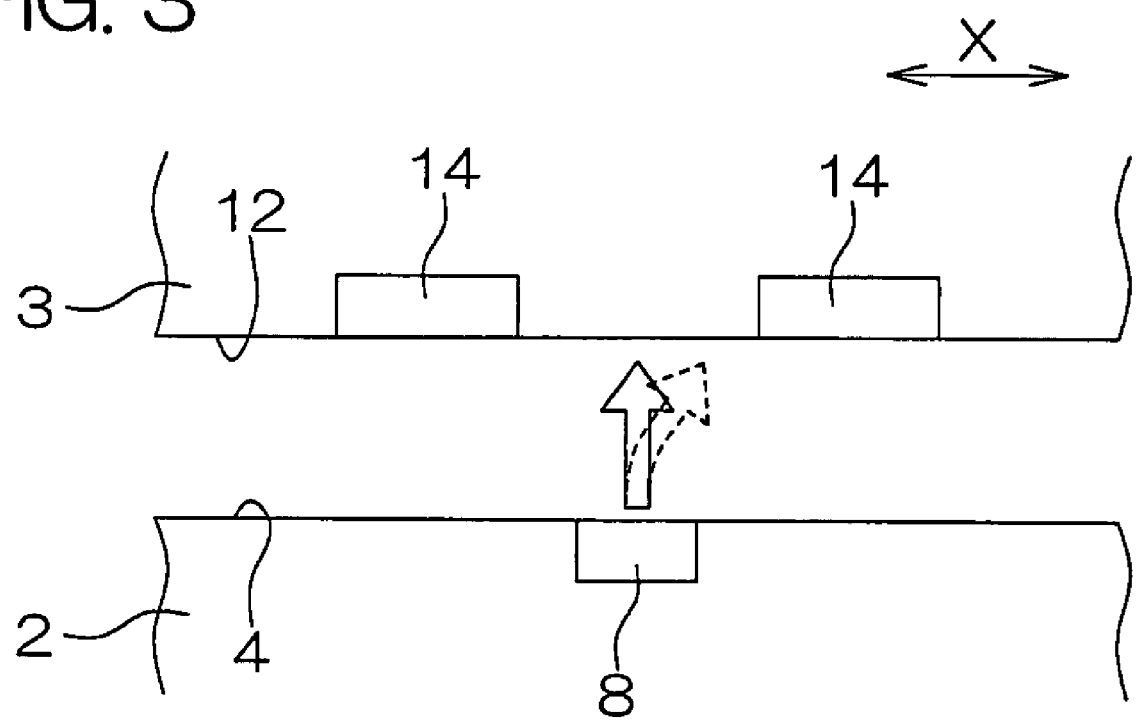

ACCELERATION SENSOR

BACKGROUND OF THE INVENTION

1. Field of the Invention

The present invention relates to a heat sensing type acceleration sensor.

2. Description of Related Art

Recently, MEMS (Micro Electro Mechanical Systems) have received increasing attention. The MEMS are microscopic electronic mechanical system parts/elements which are produced by means of semiconductor microfabrication techniques. As a typical MEMS, an acceleration sensor is known for detecting acceleration of an object.

For example, a heat sensing type acceleration sensor includes a substrate having a recess on the surface thereof, four thermocouples installed on the recess, and a heater disposed at the center of the four thermocouples. Among the four thermocouples, two the thermocouples are disposed along the X axis at mutually opposite sides at equal intervals with respect to the heater, and the other two the thermocouples are disposed along the Y axis orthogonal to the X axis at mutually opposite sides at equal intervals with respect to the heater.

When the heater is energized, the surrounding air is heated by the heat from the heater, and temperature gradients symmetrical with respect to the X axis direction and the Y axis direction are generated. The pairs of the thermocouples disposed on the X axis and the Y axis, respectively, are disposed at equal intervals from the heater, so that when the acceleration sensor stands stationary, a temperature difference detected by each pair of the thermocouples is zero. On the other hand, when acceleration in the X axis direction is applied to the acceleration sensor, the air temperature distribution shifts to the X axis direction, and the temperatures detected by the pair of the thermocouples disposed on the X axis become different from each other. When acceleration in the Y axis direction is applied to the acceleration sensor, the air temperature distribution shifts to the Y axis direction, and the temperatures detected by the pair of the thermocouples disposed on the Y axis become different from each other. Therefore, based on the temperature differences detected by the respective pairs of the thermocouples, a direction and magnitude of acceleration applied to the acceleration sensor can be detected.

However, in the above-described heat sensing type acceleration sensor, it is necessary to form a recess on the surface of the substrate and to install a heater and four thermocouples on the recess, resulting in complicated production process and high cost.

SUMMARY OF THE INVENTION

An object of the present invention is to provide a heat sensing type acceleration sensor which can simplify the production process and reduce the production costs.

An acceleration sensor according to one aspect of the present invention includes a heating chip formed with a heating element on a surface thereof, and a sensor chip formed with a thermocouple element on a surface thereof and disposed so that the surface thereof faces the surface of the heating chip.

According to this configuration, the surface on the thermocouple element side of the sensor chip is disposed so as to face the surface on the heating element side of the heating chip. When the heating elements of the heating chip are energized, heat from the respective heating elements is radiated toward the sensor chip. The heat radiation state changes when acceleration is applied to the acceleration sensor. Therefore, detecting the heat radiation state change by the thermocouple elements determines whether acceleration has been applied to the acceleration sensor.

In the production process of the conventional heat sensing type acceleration sensor, the steps of forming a recess on the substrate and installing a heater and the thermocouples on the recess are required. However, such steps are not required in the production process of this acceleration sensor. Therefore, the production process is simplified, and the acceleration sensor can be produced at a low cost.

When one thermocouple element is disposed on each of the both sides that sandwich the position facing the heating element on the surface of the sensor chip, the acceleration magnitude in the arrangement direction of the thermocouple elements can be detected based on a difference between temperatures detected by the pair of thermocouple elements. For each of the thermocouple elements, when thermocouple elements are further disposed at an interval in a direction orthogonal to the arrangement direction, the magnitude of acceleration in the direction orthogonal to the arrangement direction can also be detected.

It is preferable that the sensor chip is disposed above the heating chip. In such a configuration, the heat from the respective heating elements satisfactorily reaches the thermocouples, so that it is possible to realize reduction in heating value of the heating elements and/or improvement in sensitivity of the thermocouple elements.

The acceleration sensor preferably includes a bump interposed between the heating chip and the sensor chip, and connects the heating chip and the sensor chip at a predetermined interval.

In such a configuration, the bump is interposed between the heating chip and the sensor chip, whereby the distance between the heating chip and the sensor chip can be accurately maintained at a predetermined interval. Therefore, a change in the heat radiation state from the heating elements can be satisfactorily detected by the thermocouple elements, and the acceleration applied to the acceleration sensor can be satisfactorily detected.

Preferably, the bump includes a heating chip side bump formed of a Au material so as to project from the surface of the heating chip, a sensor chip side bump formed of a Au material so as to project from the surface of the sensor chip, and a connecting metal formed of a Sn material for connecting the heating chip side bump and the sensor chip side bump.

In such a configuration, the bump to be interposed between the heating chip and the sensor chip is formed by connecting a heating chip side bump and a sensor chip side bump formed of a Au material with a connecting metal formed of a Sn material. The Sn material has a melting point lower than that of the Au material, so that the Sn material that is a material of the connecting metal is provided on the tip end of the heating chip side bump and/or the sensor chip side bump, and heated and fused while in abutment of the heating chip side bump and the sensor chip side bump each other, the heating chip side bump and the sensor chip side bump can be reliably connected to each other.

It is preferable that the acceleration sensor also includes a resin package for sealing the heating chip and the sensor chip.

In such a configuration, the heating chip and the sensor chip are sealed by the resin package, so that the heat radiation state from the heating elements can be prevented from changing by influence from the outside of the resin package. Therefore, the change in the heat radiation state from the heating elements can be satisfactorily detected by the thermocouple elements. Accordingly, acceleration applied to the acceleration sensor can be satisfactorily detected.

The above-described or other objects, features, and effects of the present invention will be made clear from the following description of an embodiment with reference to the accompanying drawings.

BRIEF DESCRIPTION OF THE DRAWINGS

FIG. 3 is a view for describing a heat radiation state from a resistor element.

DETAILED DESCRIPTION OF PREFERRED EMBODIMENTS

Hereinafter, an embodiment of the present invention will be described in detail with reference to the accompanying drawings.

Figure 1:
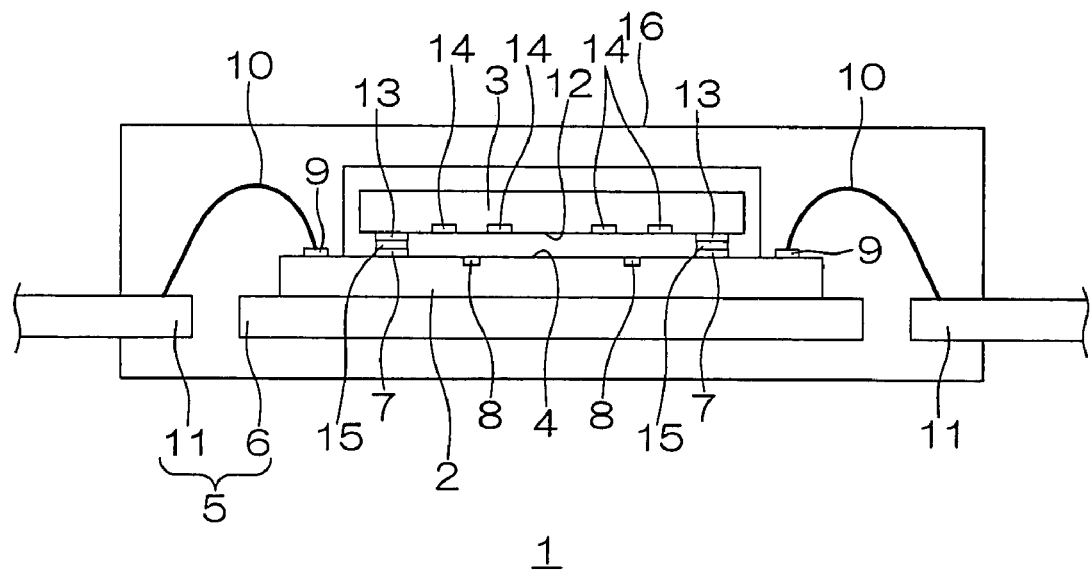
FIG. 1 is a schematic sectional view showing a construction of an acceleration sensor according to an embodiment of the present invention.

FIG. 1 is a schematic sectional view showing a construction of an acceleration sensor according to an embodiment of the present invention.

The acceleration sensor 1 is a heat sensing type acceleration sensor. This acceleration sensor 1 has a chip-on-chip structure in which a heating chip 2 and a sensor chip 3 are bonded to each other so that surfaces thereof face each other.

The heating chip 2 is formed into a substantially rectangular shape in a plan view. The heating chip 2 is die-bonded to an island 6 of a lead frame 5 in a face-up posture with the surface 4 thereof facing up. On the central portion of the surface 4 of the heating chip 2, a substantially rectangular chip bonding region is set to which the sensor chip 3 is bonded.

In the chip bonding region, a plurality of heating chip side bumps 7 are disposed at intervals along the periphery of the chip bonding region. Each heating chip side bump 7 is made of a Au material so as to project from the surface 4. In the chip bonding region, for example, four resistor elements 8 as heating elements are formed.

On the surface 4 of the heating chip 2, a plurality of external connecting pads 9 are provided on peripheral portions surrounding the chip bonding region. The external connecting pads 9 are electrically connected (wire-bonded) to leads 11 of the lead frame 5 via bonding wires 10.

The sensor chip 3 is formed into a substantially rectangular shape smaller than the heating chip 2 in a plan view. The sensor chip 3 is bonded to the chip bonding region of the surface 4 of the heating chip 2 in a face-down posture with the surface 12 thereof facing down.

On the surface 12 of the sensor chip 3, a plurality of sensor chip side bumps 13 are disposed at positions facing the respective heating chip side bumps 7 of the heating chip 2. Each heating chip side bump 7 is formed of a Au material so as to project from the surface 12. Furthermore, in the surface of the sensor chip 3, for example, sixteen thermocouple elements 14 are formed.

In a state that the heating chip 2 and the sensor chip 3 are bonded to each other, each heating chip side bump 7 of the heating chip 2 and each sensor chip side bump 13 of the sensor chip 3 face each other while top faces thereof abut against each other, and are connected to each other via a connecting metal 15 made of a Sn material.

In a state before bonding of the heating chip 2 and the sensor chip 3, the Sn material that is a material of the connecting metal 15 is applied onto the top faces of the sensor chip side bumps 13 of the sensor chip 3. Then, in a state that the heating chip 2 and the sensor chip 3 are bonded, and the heating chip side bumps 7 of the heating chip 2 and the sensor chip side bumps 13 of the sensor chip 3 are abutted against each other, heat treatment is applied, thereby, the Sn material on the top faces of each sensor chip side bumps 13 is fused. Consequently, a connecting metal 15 is formed between each heating chip side bump 7 and each sensor chip side bump 13. By the connecting metal 15, each heating chip side bump 7 and each sensor chip side bump 13 can be reliably connected to each other.

By connecting each heating chip side bump 7 and each sensor chip side bump 13 via the connecting metal 15, the heating chip 2 and the sensor chip 3 are electrically connected to each other and mechanically connected to each other while maintaining a predetermined distance therebetween via the respective bumps formed by connecting the heating chip side bumps 7 and the sensor chip side bumps 13 by the connecting metals 15.

Then, the heating chip 2 and the sensor chip 3 are sealed by a resin package 16 together with the lead frame 5 and the bonding wires 10. A portion of the lead 11 of the lead frame 5 is exposed from the resin package 16 and functions as an external connector (outer lead) for connection to a printed circuit board.

Figure 2:
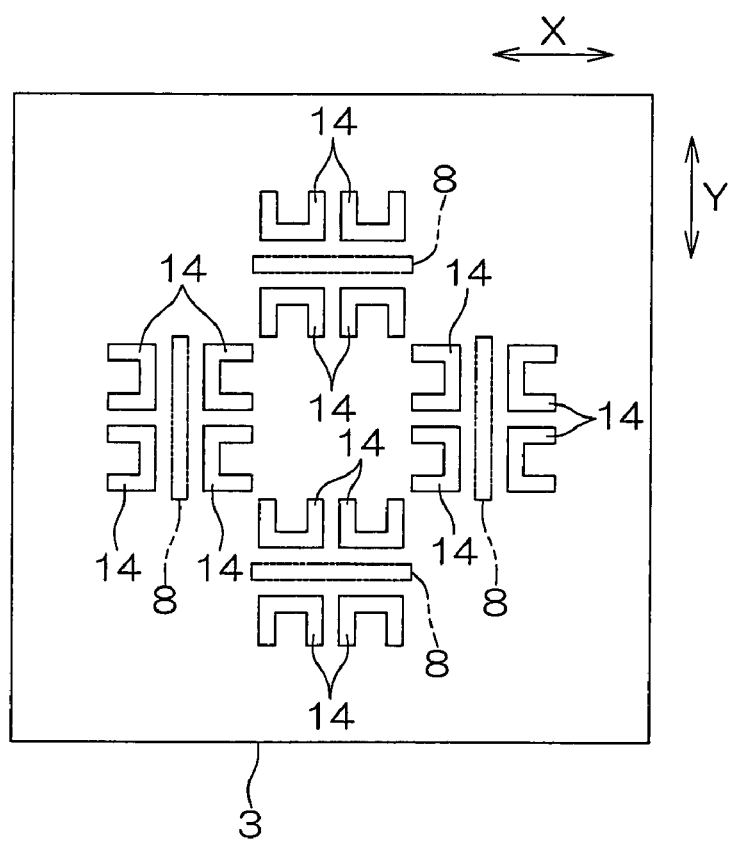
FIG. 2 is a plan view showing a surface of a sensor chip.

FIG. 2 is a plan view showing the surface 12 of the sensor chip 3. In this FIG. 2, the respective resistor elements 8 of the heating chip 2 are projected on the surface 12 of the sensor chip 3. In FIG. 2, illustration of the sensor chip side bumps 13 of the sensor chip 3 is omitted.

The four resistor elements 8 of the heating chip 2 are disposed on the surface 4 of the heating chip 2; one each on both sides in the X direction along one side of the chip bonding region with respect to the center of the chip bonding region and one each on both sides in the Y direction orthogonal to the X direction with respect to the center of the chip bonding region. The resistor elements 8 arranged on both sides in the X direction with respect to the center of the chip bonding region extend in the Y direction at positions at equal intervals in the X direction from the center of the chip bonding region. On the other hand, the resistor elements 8 arranged on both sides in the Y direction with respect to the center of the chip bonding region extend in the X direction at positions at equal intervals in the Y direction from the center of the chip bonding region.

The sixteen thermocouple elements 14 of the sensor chip 3 are correspondent by four to each resistor element 8. The four thermocouple elements 14 corresponding to each resistor element 8 that extends in the X direction are arranged by two to be symmetrical each other on both sides in the Y direction with respect to the projection of each resistor element 8 on the surface 12 of the sensor chip 3. The four thermocouple elements 14 corresponding to each resistor element 8 that extends in the Y direction are arranged by two to be symmetrical each other on both sides in the X direction with respect to the projection of each resistor element 8 on the surface 12 of the sensor chip 3.

Hereinafter, among four thermocouple elements 14 corresponding to each resistor element 8 that extends in the X direction, a pair of two thermocouple elements 14 symmetrical to each other in the Y direction with respect to the projection of the resistor element 8 will be simply referred to as "the pair of the thermocouples 14 in the Y direction." In addition, among four thermocouple elements 14 corresponding to each resistor element 8 that extends in the Y direction, a pair of two thermocouple elements 14 symmetrical to each other in the X direction with respect to the projection of the resistor element 8 will be simply referred to as "the pair of thermocouple elements 14 in the X direction."

FIG. 3 is a view for describing a heat radiation state from the resistor element 8.

When each resistor element 8 of the heating chip 2 is energized, heat from each resistor element 8 is evenly radiated in the X direction and the Y direction toward the sensor chip 3.

The pair of thermocouple elements 14 in the Y direction are arranged symmetrically in the Y direction with respect to the projection of each resistor element 8 on the surface 12 of the sensor chip 3, so that in a state that the acceleration sensor 1 stands stationary, a difference between the temperatures detected by the paired thermocouple elements 14 is zero. The pair of thermocouple elements 14 in the X direction are arranged symmetrically to each other in the X direction with respect to the projection of each resistor element 8 on the surface 12 of the sensor chip 3, so that in a state that the acceleration sensor 1 stands stationary, a difference between the temperatures detected by the paired thermocouple elements 14 is zero.

When an acceleration in the X direction is applied to the acceleration sensor 1, as shown by the dashed arrow in FIG. 3, the radiation direction of the heat from each resistor element 8 deflects to the X direction. Therefore, a difference is formed in the temperatures detected by each of the paired thermocouple elements 14 in the X direction. When an acceleration in the Y direction is applied to the acceleration sensor 1, the radiation direction of the heat from each resistor element 8 deflects to the Y direction. Therefore, a difference is found in the temperatures detected by each of the paired thermocouple elements 14 in the Y direction. Accordingly, based on the differences between temperatures detected by each pair of thermocouple elements 14 in the X direction and each pair of thermocouple elements 14 in the Y direction, the direction and magnitude of the acceleration applied to this acceleration sensor 1 can be detected.

Preferably, the sensor chip 3 is disposed above the heating chip 2. In such a configuration, the heat from the respective resistor elements 8 satisfactorily reaches the respective thermocouple elements 14, so that reduction in heating value of the respective resistor elements 8 and/or improvement in sensitivity of the respective thermocouple elements 14 can be realized.

As described above, in the acceleration sensor 1, the resistor elements 8 are provided on the surface 4 of the heating chip 2. On the other hand, the thermocouple elements 14 are provided on the surface 12 of the sensor chip 3. The heating chip 2 and the sensor chip 3 are bonded in a face-to-face state that each of the surfaces 4 and 12 face each other. The production process of the acceleration sensor 1 in such a configuration can eliminate a complex step (e.g., forming a recess on the substrate and installing a heater and the thermocouples on the recess) in the production process of the conventional heat sensing type acceleration sensor. Therefore, the acceleration sensor 1 is simple in its production process and can be produced at a low cost.

Since a bump formed by connecting the heating chip side bump 7 and the sensor chip side bump 13 by a connecting metal 15 is interposed between the heating chip 2 and the sensor chip 3, the distance between the heating chip 2 and the sensor chip 3 can be accurately maintained at a predetermined interval. Therefore, a change in the heat radiation state from each resistor element 8 can be satisfactorily detected by each thermocouple element 14, and the acceleration applied to the acceleration sensor 1 can be satisfactorily detected.

Furthermore, the heating chip 2 and the sensor chip 3 are sealed by the resin package 16, so that the state of heat radiation from each resistor element 8 can be prevented from changing by an influence from the outside of the resin package 16. Therefore, the change in the heat radiation state from the resistor elements 8 can be satisfactorily detected, and the acceleration applied to the acceleration sensor 1 can be satisfactorily detected.

In this embodiment, a configuration is illustrated in which four resistor elements 8 are provided on the heating chip 2. However, the number of resistor elements 8 to be provided on the heating chip 2 may be one to three, or may be five or more.

Further, a configuration is illustrated above in which four thermocouple elements 14 are provided corresponding to each resistor element 8. However, it is only required that one or more thermocouple elements 14 are provided corresponding to each resistor element 8.

The embodiment of the present invention has been described in detail above. However, it is merely a detailed example used for making clear the technical idea of the present invention. The present invention should not be construed limitative to thereto, and the spirit and scope of the present invention are limited only by claims attached hereto.

The present application corresponds to Japanese Patent Application No. 2006-212352 filed on Aug. 3, 2006 to Japan Patent Office, and the whole disclosure of this application is incorporated herein by reference.

What is claimed is:

1. An acceleration sensor comprising:
   a heating chip formed with a heating element on a surface thereof;
   a sensor chip formed with a thermocouple element on a surface thereof and disposed so that the surface thereof faces the surface of the heating chip; and
   a bump interposed between the heating chip and the sensor chip, said bump connecting the heating chip and the sensor chip to each other at a predetermined distance therebetween, wherein
   the bump includes:
      a heating chip side bump projecting from the surface of the heating chip;
      a sensor chip side bump projecting from the surface of the sensor chip; and
      a connecting metal connecting the heating chip side bump and the sensor chip side bump to each other.

2. The acceleration sensor according to claim 1, wherein: said heating chip side bump is formed of an Au material; said sensor chip side bump is formed of an Au material; and said connecting metal is formed of an Sn material.

3. The acceleration sensor according to claim 1, comprising a resin package that seals the heating chip and the sensor chip.

* * * * *